(12) United States Patent
Liu et al.

(10) Patent No.: US 11,723,295 B2
(45) Date of Patent: Aug. 8, 2023

(54) FABRICATION METHOD OF MEMORY DEVICE

(71) Applicant: United Microelectronics Corp., Hsinchu (TW)

(72) Inventors: Hai Tao Liu, Singapore (SG); Li Li Ding, Singapore (SG); Yao-Hung Liu, Tainan (TW); Guoan Du, Singapore (SG); Qi Lu Li, Singapore (SG); Chunlei Wan, Singapore (SG); Yi Yu Lin, Singapore (SG); Yuchao Chen, Singapore (SG); Huakai Li, Singapore (SG); Hung-Yueh Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 17/551,214

(22) Filed: Dec. 15, 2021

(65) Prior Publication Data

US 2022/0109104 A1 Apr. 7, 2022

Related U.S. Application Data

(62) Division of application No. 16/505,190, filed on Jul. 8, 2019, now Pat. No. 11,239,419.

(30) Foreign Application Priority Data

Jun. 5, 2019 (CN) .......................... 201910484945.8

(51) Int. Cl.
*H01L 45/00* (2006.01)
*H01L 27/24* (2006.01)
*H10N 70/00* (2023.01)
*H10B 63/00* (2023.01)
*H10N 70/20* (2023.01)

(52) U.S. Cl.
CPC ......... *H10N 70/8833* (2023.02); *H10B 63/80* (2023.02); *H10N 70/028* (2023.02); *H10N 70/24* (2023.02); *H10N 70/826* (2023.02); *H10N 70/8265* (2023.02); *H10N 70/841* (2023.02)

(58) Field of Classification Search
CPC .............. H01L 45/1633; H01L 45/146; H01L 45/1233; H01L 45/08; H01L 45/147
See application file for complete search history.

(56) References Cited

U.S. PATENT DOCUMENTS

| | | |
|---|---|---|
| 9,806,255 B1 | 10/2017 | Hsu et al. |
| 9,859,335 B1 | 1/2018 | Hsu et al. |
| 2003/0137869 A1 | 7/2003 | Kozicki |
| 2009/0014710 A1 | 1/2009 | Kawashima et al. |
| 2012/0238055 A1 | 9/2012 | Mikawa et al. |
| 2013/0112935 A1 | 5/2013 | Himeno et al. |
| 2014/0175371 A1 | 6/2014 | Karpov et al. |

(Continued)

*Primary Examiner* — John A Bodnar
(74) *Attorney, Agent, or Firm* — JCIPRNET

(57) ABSTRACT

A method for fabricating memory device includes: providing a substrate having a bottom electrode layer therein, forming a buffer layer and a mask layer on the buffer layer over the substrate, in contact with the bottom electrode layer, performing an advanced oxidation process on a sidewall of the buffer layer to form a resistive layer, which surrounds the whole sidewall of the buffer layer and extends upward vertically from the substrate, and forming, over the substrate, a noble metal layer and a top electrode layer on the noble metal layer, fully covering the resistive layer and the mask layer.

10 Claims, 8 Drawing Sheets

(56) References Cited

U.S. PATENT DOCUMENTS

2015/0028281 A1 1/2015 Chen et al.
2015/0221700 A1 8/2015 Cho
2016/0149125 A1 5/2016 Oh et al.

FABRICATION METHOD OF MEMORY DEVICE

CROSS-REFERENCE TO RELATED APPLICATION

This application is a divisional application of and claims the priority benefit of U.S. application Ser. No. 16/505,190, filed on Jul. 8, 2019, now allowed, which claims the priority benefit of Chinese Patent Application Serial No. 201910484945.8, filed on Jun. 5, 2019. The entirety of each of the above-mentioned patent applications is hereby incorporated by reference herein and made a part of this specification.

BACKGROUND OF THE INVENTION

1. Field of the Invention

The present invention generally relates to a semiconductor fabrication technology, in particular, to a structure of a resistive memory device and a fabrication method thereof.

2. Description of Related Art

A non-volatile memory is almost indispensable in a digital electronic product. Digital electronic products, for example, computers, mobile phones, cameras, and video recorders, are also indispensable products in daily life. Therefore, non-volatile memories are commonly in demand.

A structure of a memory cell of a non-volatile memory may be designed in various different ways, and a corresponding structure may be provided for a different storage manner. To reduce an area occupied by a device, a vertical memory cell, for example, a resistive memory device, has been proposed, and the resistive memory device may have two stable resistance values by using resistance variation characteristics of a memory material under control of an applied voltage, so as to store one-bit data.

However, a fabrication process is different for a different structure of a memory cell, and an inappropriate structural design may cause difficulty in fabrication and may even easily cause a failure in fabrication of a device.

How to design a structure of a memory cell of a non-volatile memory is also a problem that needs to be considered during research and development of a memory.

SUMMARY OF THE INVENTION

The present invention is directed to a structure of a memory device and a fabrication method thereof. The memory device is a resistive memory device, and a memory material layer extends in a vertical direction.

According to an embodiment, the present invention provides a structure of a memory device, including a substrate. The substrate includes a bottom electrode layer. A buffer layer is disposed on the substrate, in contact with the bottom electrode layer. A resistive layer surrounds a whole sidewall of the buffer layer and extends upward vertically from the substrate. A mask layer is disposed on the buffer layer and the resistive layer. A noble metal layer is over the substrate and fully covers the resistive layer and the mask layer. A top electrode layer is disposed on the noble metal layer.

According to an embodiment, in the structure of memory device, the resistive layer includes a transition metal oxide layer.

According to an embodiment, in the structure of memory device, the buffer layer is an oxygen trap layer.

According to an embodiment, in the structure of memory device, the buffer layer includes Hf, $HfO_x$, Ta, $TaO_x$, $NiO_x$, $TiO_x$, $ZrO_x$, or $ZnO_x$.

According to an embodiment, in the structure of a memory device, an oxygen content of the transition metal oxide layer is in a saturation state.

According to an embodiment, in the structure of memory device, a size of the resistive layer is determined by a horizontal thickness of the resistive layer and a thickness of the buffer layer.

According to an embodiment, in the structure of memory device, the noble metal layer reduces oxygen diffused into or away from the resistive layer.

According to an embodiment, in the structure of memory device, the top electrode layer is thicker than the noble metal layer and a thickness of the noble metal layer is in a range of 30 to 50 angstroms.

According to an embodiment, in the structure of memory device, the substrate includes a base layer including an interconnection line structure therein. An inter-layer dielectric layer is disposed on the base layer and includes an opening. A through via structure is filling into a lower portion of the opening. The bottom electrode layer is filling into an upper portion of the opening.

According to an embodiment, in the structure of memory device, the substrate includes a base layer including an interconnection line structure therein. An inter-layer dielectric layer is disposed on the base layer and includes an opening. A through via structure is filling into a lower portion of the opening. The bottom electrode layer is disposed on the inter-layer dielectric layer and above the through via structure. The noble metal layer and the bottom electrode layer are isolated at least by the resistive layer.

According to an embodiment, the present invention provides a method for fabricating a memory device. The method includes providing a substrate, having a bottom electrode layer therein. A buffer layer and a mask layer on the buffer layer are formed on the substrate in contact with the bottom electrode layer. An advanced oxidation process is performed on a sidewall of the buffer layer to form a resistive layer, the resistive layer is surrounding the whole sidewall of the buffer layer and extending upward vertically from the substrate. A noble metal layer and a top electrode layer on the noble metal layer are formed over the substrate, fully covering the resistive layer and the mask layer.

According to an embodiment, in the method for fabricating memory device, the resistive layer includes a transition metal oxide layer.

According to an embodiment, in the method for fabricating memory device, the buffer layer is an oxygen trap layer.

According to an embodiment, in the method for fabricating memory device, the buffer layer includes Hf, $HfO_x$, Ta, $TaO_x$, $NiO_x$, $TiO_x$, $ZrO_x$, or $ZnO_x$.

According to an embodiment, in the method for fabricating memory device, an oxygen content of the transition metal oxide layer is in a saturation state.

According to an embodiment, in the method for fabricating memory device, a size of the resistive layer is determined by a horizontal thickness of the resistive layer and a thickness of the buffer layer.

According to an embodiment, in the method for fabricating memory device, the noble metal layer reduces oxygen diffused into or away from the resistive layer.

According to an embodiment, in the method for fabricating memory device, the top electrode layer is thicker than the noble metal layer and a thickness of the noble metal layer is in a range of 30 to 50 angstroms.

According to an embodiment, in the method for fabricating memory device, the step of providing the substrate includes providing a base layer, having an interconnection line structure therein. An inter-layer dielectric layer is formed on the base layer, the inter-layer dielectric layer includes an opening. A through via structure is formed, filling into a lower portion of the opening. The bottom electrode layer is formed, filling into an upper portion of the opening.

According to an embodiment, in the method for fabricating memory device, the step of providing the substrate includes providing a base layer, having an interconnection line structure therein. An inter-layer dielectric layer is formed on the base layer, the inter-layer dielectric layer includes an opening. A through via structure is formed, filling into a lower portion of the opening. The bottom electrode layer is formed on the inter-layer dielectric layer and above the through via structure. The noble metal layer and the bottom electrode layer are isolated at least by the resistive layer.

BRIEF DESCRIPTION OF THE DRAWINGS

The accompanying drawings are included to provide a further understanding of the present invention, and are incorporated in and constitute a part of this specification. The accompanying drawings illustrate embodiments of the present invention and, together with the description, serve to explain the principles of the present invention.

DESCRIPTION OF THE EMBODIMENTS

The present invention is directed to a structure of a memory device and a fabrication method thereof. The structure of a memory device is a resistive memory cell, a bottom electrode layer may be positioned accurately, and a resistive layer is designed to extend in a vertical direction.

The prevent invention will be described according to a plurality of embodiments below, but is not limited to the plurality of embodiments. Additionally, the plurality of embodiments is allowed to be combined appropriately.

Figure 1:
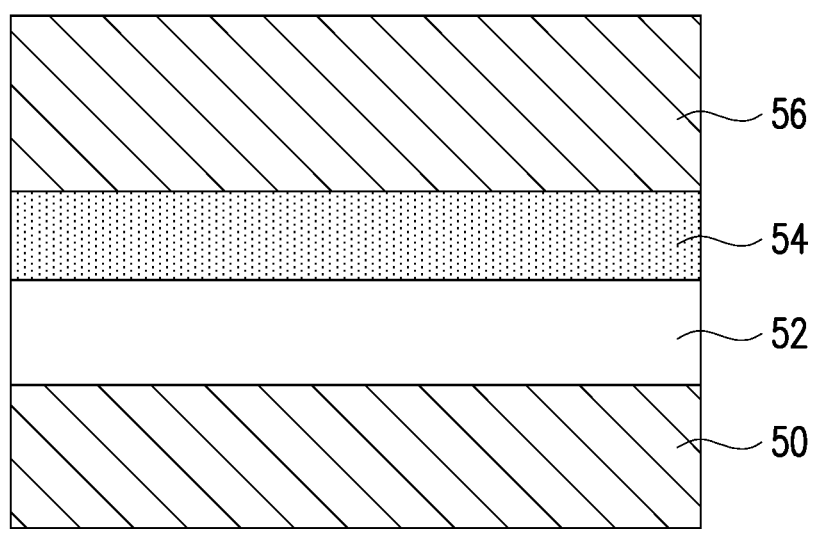
FIG. 1 is a schematic view of a resistive storage mechanism according to an embodiment of the present invention.

A memory cell of a resistive memory device has a vertical structure. FIG. 1 is a schematic view of a resistive storage mechanism according to an embodiment of the present invention. Referring to FIG. 1, for example, a transition metal oxide (TMO) serves as a structure of a storage mechanism. A TMO layer 54, for example, a $Ta_2O_5$ layer, exists between a bottom electrode layer 50 and a top electrode layer 56. In addition, a buffer layer 52 is, for example, a $TaO_x$ layer, and serves as an oxygen trap layer. Materials of the buffer layer 52 and the TMO layer 54 will be described in detail below. Oxygen ions in the buffer layer 52 may be controlled to enter or leave the TMO layer 54 by biases generated by the bottom electrode layer 50 and the top electrode layer 56, to cause a change of a resistance value. Since the TMO layer 54 has two stable resistance value states, it may be used to store one-bit data.

Figure 2:
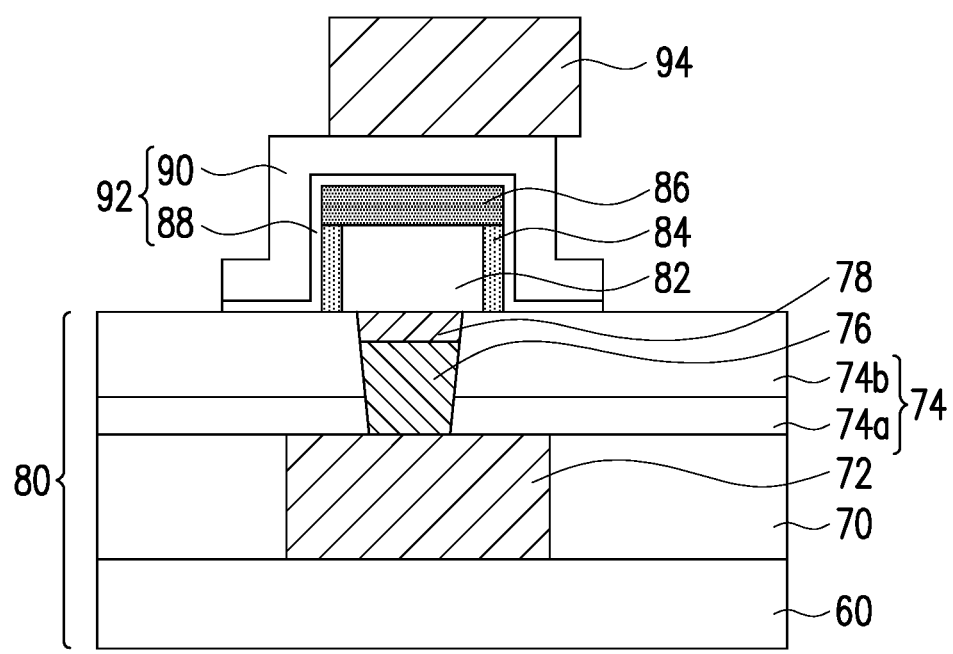
FIG. 2 is a schematic structural view of a resistive memory device according to an embodiment of the present invention.

FIG. 2 is a schematic structural view of a resistive memory device according to an embodiment of the present invention. Referring to FIG. 2, in an embodiment, the structure of a memory device includes a substrate 80. The substrate 80 includes a bottom electrode layer 78 therein. Herein, in the substrate 80, for example, a silicon substrate 60 serves as a structural basis. An interconnection line structure 72 is at least formed on the silicon substrate 60 through an inter-layer dielectric layer 70 by using a semiconductor fabrication process. A whole including the silicon substrate 60, the inter-layer dielectric layer 70, and the interconnection line structure 72 may be referred to as a base layer. The present invention is not limited to a specific structure of the base layer. For example, another element structure, such as a transistor connected to the interconnection line structure 72, may also be formed on the silicon substrate 60.

On the base layer, to fabricate the memory cell of the resistive memory device, another inter-layer dielectric layer 74 is further formed on the base layer, for example, the inter-layer dielectric layer 74 is formed on the inter-layer dielectric layer 70. The inter-layer dielectric layer 74 is, for example, formed of a plurality of inter-layer dielectric layers 74a and 74b, which may be, for example, a combination of oxides or nitrides. However, the present invention is not limited to the embodiment. The inter-layer dielectric layer 74 may include other structures according to a whole actual circuit structure, and other element structures are not limited in the present invention. Regarding the memory cell, the inter-layer dielectric layer 74 also has an opening corresponding to the interconnection line structure 72. In an embodiment, the through via structure 76 is only filling into a lower portion of the opening, and a bottom electrode layer 78 is additionally formed in the upper portion of the opening. The bottom electrode layer 78, the through via structure 76, and the interconnection line structure 72 are, for example, electrically connected.

In an embodiment, the through via structure 76 may also be filling into the opening, and in this way, the bottom electrode layer 78 may be formed on the inner-layer dielectric layer 74 and disposed on the through via structure 76. The present invention is not limited to a specific electric connection manner between the bottom electrode layer 78 and the interconnection line structure 72.

After the bottom electrode layer 78 is fabricated, a buffer layer 82 is disposed on the inner-layer dielectric layer 74 of the substrate 80 and in contact with the bottom electrode layer 78. In an embodiment, the buffer layer 82 is, for example, an oxygen trap layer, the material of which is a material containing a transition metal or an oxide thereof, and further may be, for example, Hf, $HfO_x$, Ta, $TaO_x$, $NiO_x$, $TiO_x$, $ZrO_x$, or $ZnO_x$. During operation, the buffer layer 82 may provide oxygen ions to enter resistive layer 84 formed subsequently, or trap oxygen ions from the resistive layer 84, to change a resistance value of the resistive layer 84, thereby achieving a function of storage.

Figure 3:
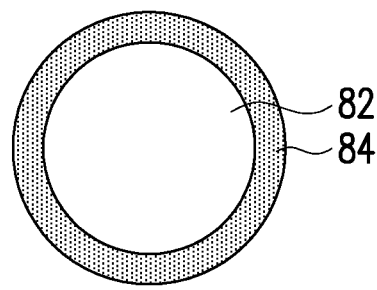
FIG. 3 is a top schematic structural view of a buffer layer and a resistive layer of a resistive memory device according to an embodiment of the present invention.
Figure 3:
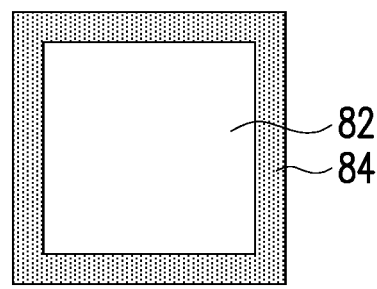

The resistive layer 84 surrounds a whole sidewall of the buffer layer 82, and extends upward vertically from the substrate 80. FIG. 3 is a top schematic structural view of a buffer layer and a resistive layer of a resistive memory device according to an embodiment of the present invention.

First, referring to FIGS. 2 and 3 at the same time, a geometrical shape of the buffer layer 82 is, for example, a circle or a quadrangle, but the geometrical shape of the buffer layer 82 in the present invention is not limited to the embodiment. According to the geometrical shape of the buffer layer 82, the resistive layer 84 surround the whole sidewall of the buffer layer 82.

As described below, for example, the resistive layer 84 is a transition metal oxide, the material thereof may be based on the material of the buffer layer 82, the sidewall of the resistive layer 84 is oxidized through an advanced oxidation process, and the oxidization degree is to make an oxygen content to approach to a saturation state.

Further referring to FIG. 2, the mask layer 86 is disposed on the buffer layer 82 and the variable resistance layer 84. A noble metal layer 88 is disposed above the substrate 80 and fully covers the resistive layer 84 and the mark layer 86. The noble metal layer 88 includes, for example, Pt, Ir, Au, Pd, Ru, Os, or Re and serves as a barrier layer, to reduce oxygen diffused into or away from the resistive layer 84, so as not to influence a storage state.

Then, a top electrode layer 90 is disposed on the noble metal layer 88. As a whole, the top electrode layer 90 and the noble metal layer 88 form a top electrode superposed layer 92. In addition, another interconnection line structure 94 is also disposed on the top electrode superposed layer 92, to electrically connect the memory cell to external device part.

Regarding the fabrication process, FIGS. 4A-4G are cross-sectional schematic structural views of a fabrication process of a resistive memory device according to an embodiment of the present invention.

Figure 4A:
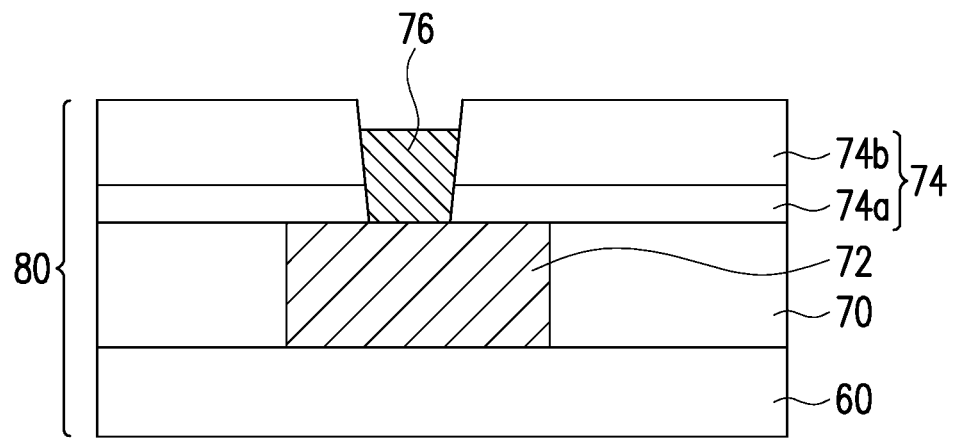
FIGS. 4A-4G are cross-sectional schematic structural views of a fabrication process of a resistive memory device according to an embodiment of the present invention.
Figure 4B:
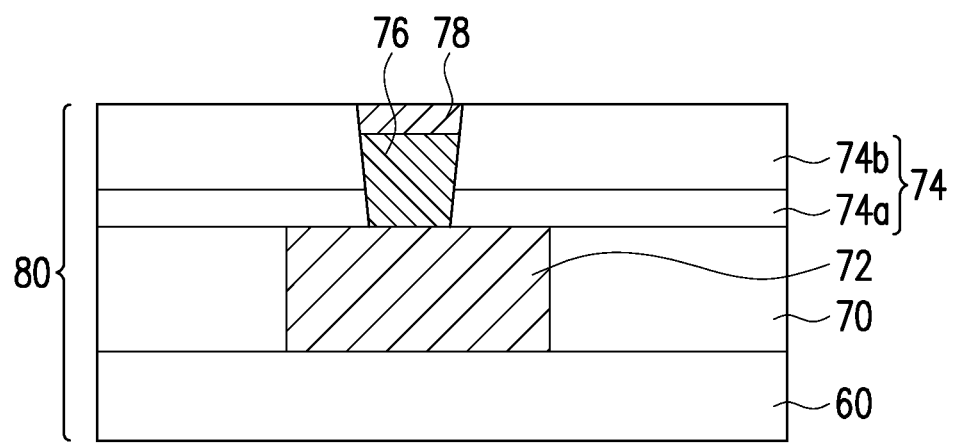

Referring to FIG. 4A, in the substrate 80, the through via structure 76 has been filling into the lower portion of the opening. The other structures have been described in FIG. 2 and will not be described repeatedly. Referring to FIG. 4B, the bottom electrode layer 78 is filling into the upper portion of the opening. In an embodiment, for example, first, a preliminary metal layer is formed to cover the inner-layer dielectric layer 74 and filling into the upper portion of the opening. The portion of the preliminary metal layer on the inner-layer dielectric layer 74 is removed by using a grinding process, and the remaining metal layer is the bottom electrode layer 78, that is, the metal layer that is filling into the lower portion of the opening. In such a manner, the bottom electrode layer 78 and the through via structure 76 may be aligned accurately.

In other embodiments, the through via structure 76 may also be all filling into the opening. In this way, the bottom electrode layer 78 may be formed on the inner-layer dielectric layer 74 and is in contact with and connected to the through via structure 76. The present invention is not limited to a specific electric connection manner between the bottom electrode layer 78 and the interconnection line structure 72.

Figure 4C:
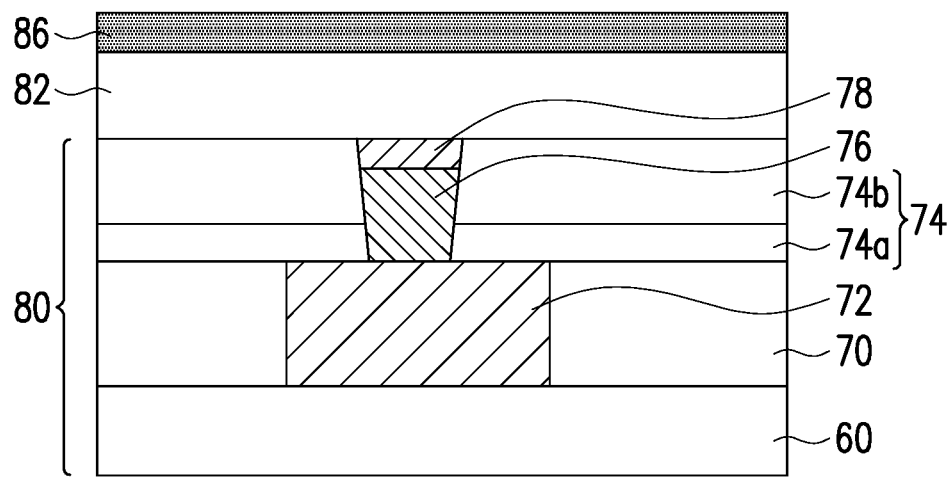
Figure 4D:
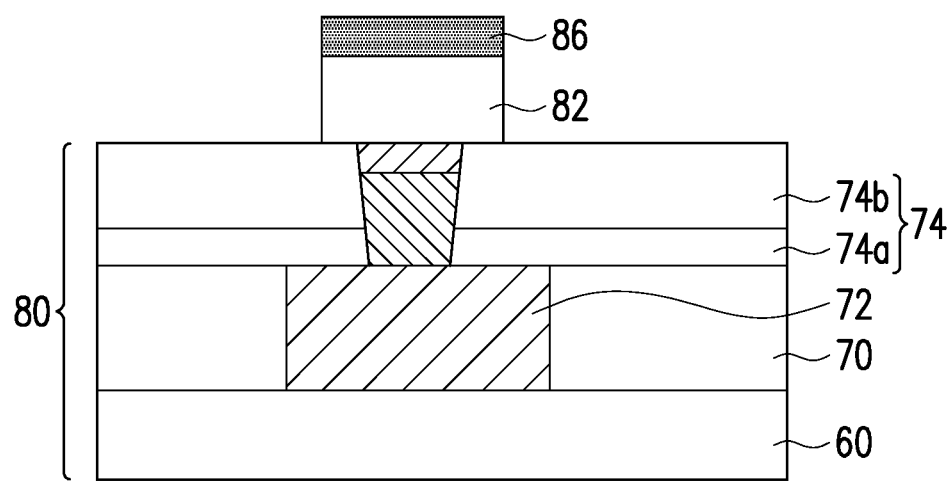
Figure 4E:
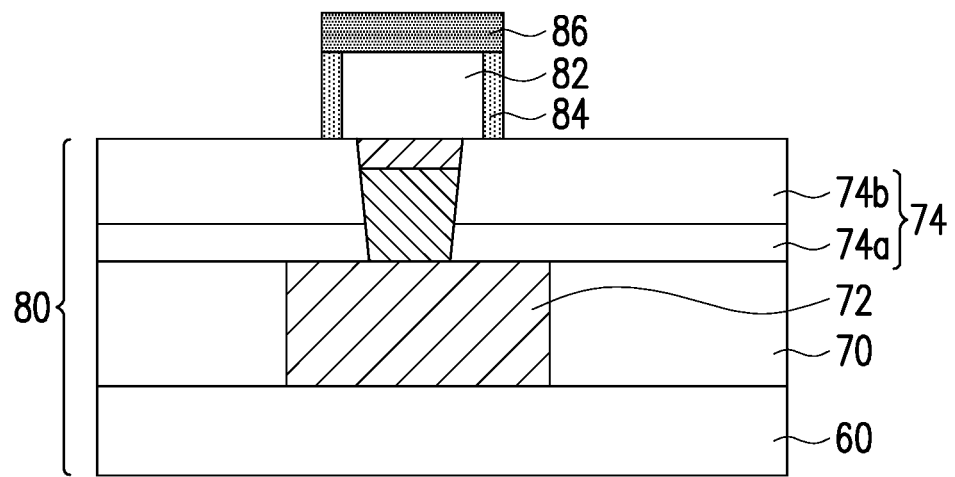

Referring to FIG. 4C, the preliminary buffer layer 82 and the mask layer 86 are superposed on the inner-layer dielectric layer 74, that is, formed on the substrate 80. Referring to FIG. 4D, the preliminary buffer layer 82 and the mark layer 86 are defined to have a needed size, and the shape is, for example, shown in the embodiment in FIG. 3.

Figure 4F:
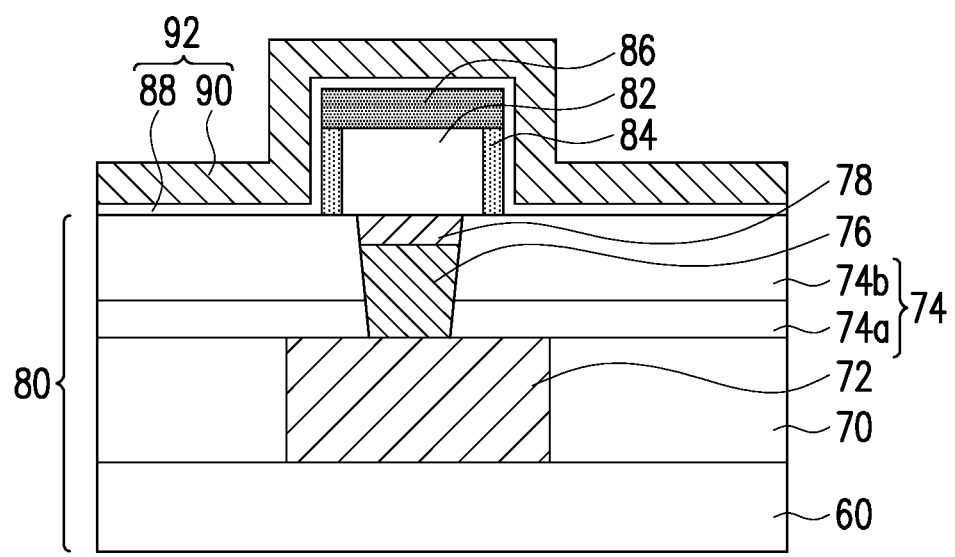

Referring to FIG. 4F, based on the material of the buffer layer 82, the top of the buffer layer 82 is protected by the mark layer 86, and then, the sidewall of the buffer layer 82 is further oxidized through the advanced oxidation process, so that the oxidization degree is substantially to make an oxygen content in a saturation state. The resistive layer 84, such as a TMO layer, is obtained after oxidation.

Referring to FIG. 4F, the top electrode superposed layer 92 is formed on the substrate 80 and covers the resistive layer 84 and the mask layer 86. Since a change of an oxygen content of the resistive layer 84 will cause a change of a resistance value thereof, and then causes an error in stored data, the top electrode superposed layer 92 includes a common top electrode layer 90 and further includes a noble metal layer 88. The noble metal layer 88 may be used to reduce oxygen diffused into or away from the resistive layer 84. A thickness of the noble metal layer is, for example, in a range of 30 to 50 angstroms. That is to say, the top electrode layer 90 is thicker than the noble metal layer. The material of the noble metal layer 88 may be, for example, Pt, Ir, Au, Pd, Ru, Os, or Re. The materials of the top electrode layer 90 and the bottom electrode layer 78 do not need to be specifically defined. In an embodiment, the metal composition of the top electrode layer 90 and the bottom electrode layer 78 may be the same as the metal composition of the buffer layer 82. In an embodiment, the buffer layer 82 is, for example, a $TaO_x$ layer, and then, for example, the top electrode layer 90 and the bottom electrode layer 78 may be TaN layers.

Figure 4G:
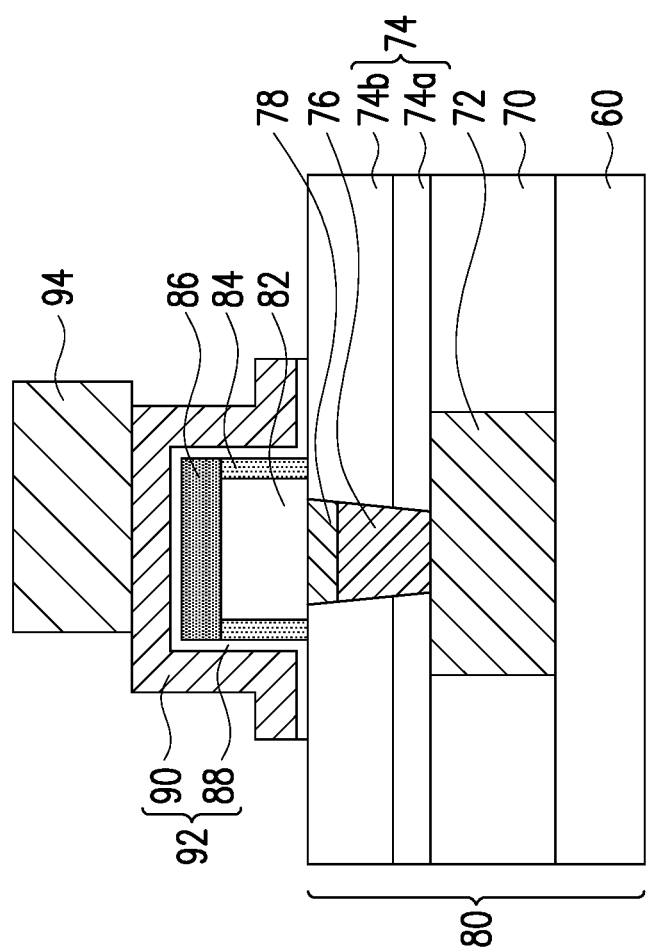

Referring to FIG. 4G, the top electrode superposed layer 92 is further defined to have an actual size. Subsequently, the following interconnection line structure 94 may be formed on the top electrode superposed layer 92 and fabricated according to an actually needed structure. The interconnection line structure 94 of the present invention is not limited to a specific structure, and the fabrication process may follow a common manner and the descriptions thereof are omitted herein.

The quality of the resistive layer 84 may determine storage performance. A larger volume of the resistive layer 84 may be advantageous to separate the state of resistance value. The size of the resistive layer 84 in the present invention may be adjusted in various manners.

Figure 5:
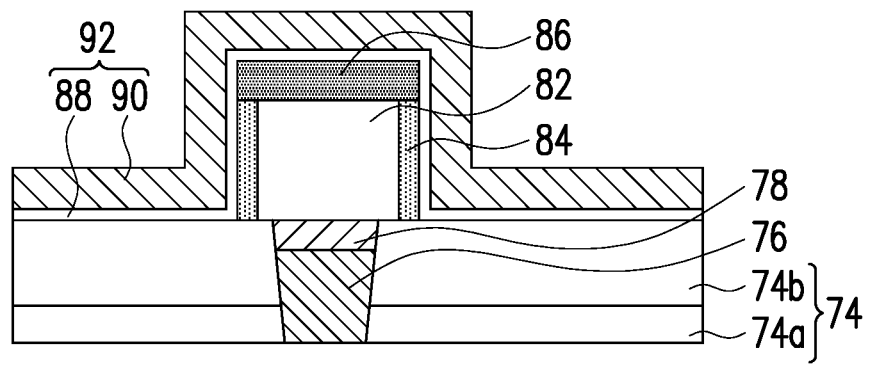
FIG. 5 is a schematic structural view of a resistive memory device according to an embodiment of the present invention.

FIG. 5 is a schematic structural view of a resistive memory device according to an embodiment of the present invention. Referring to FIG. 5, compared with FIGS. 4E and 4F, a height of the resistive layer 84 is increased by increasing a thickness of the buffer layer 82, and thus, the volume may be increased correspondingly.

Figure 6:
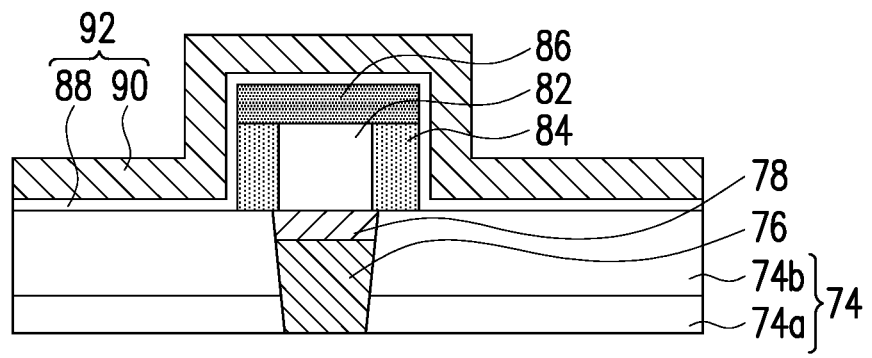
FIG. 6 is a schematic structural diagram of a resistive memory device according to an embodiment of the present invention.

FIG. 6 is a schematic structural view of a resistive memory device according to an embodiment of the present invention. Referring to FIG. 6, compared with FIGS. 4E and 4F, a horizontal thickness of the resistive layer 84 may be increased. As shown in FIG. 3, the resistive layer 84 is a ring-shaped structure. The volume of the resistive layer 84 may also be increased by increasing a thickness of the ring.

Therefore, according to the manners in FIGS. 5 and 6, the volume of the ring-shaped resistive layer 84 may be adjusted by changing the thickness and/or height. An area occupied by the memory device is unchanged and a predetermined device density may be maintained.

In the present invention, the buffer layer 82 is used and the resistive layer 84 is formed on the sidewall of the buffer layer 82, to fabricate the resistive memory device. In addition, in an embodiment, the bottom electrode layer 78 may also be formed in the opening to be accurately connected with the through via structure.

Finally, it should be noted that, the foregoing embodiments are merely used to describe the technical solution of the present invention, rather than limiting the present invention. Although the present invention is described in detail with reference to the foregoing embodiment, a person of ordinary skill in the art should understand that, the technical solutions of the foregoing embodiments may also be modified or equivalent substitutions may be performed on some or all technical features. The modifications and substitutions do not cause the essence of the corresponding technical solutions to depart from the scope of the technical solutions of the present invention.

What is claimed is:

1. A method for fabricating memory device, comprising:
   providing a substrate, having a bottom electrode layer therein;
   forming a buffer layer and a mask layer on the buffer layer over the substrate, wherein the buffer layer is in contact with the bottom electrode layer, and a top surface of the bottom electrode layer is covered by the buffer layer;
   performing an oxidation process on a peripheral portion of the buffer layer to form the peripheral portion of the buffer layer into a resistive layer, wherein the resistive layer laterally surrounds a remaining portion of the buffer layer after the oxidation process and extends upward vertically from the substrate; and
   forming, over the substrate, a noble metal layer and a top electrode layer on the noble metal layer, fully covering the resistive layer and the mask layer.

2. The method for fabricating memory device according to claim 1, wherein the resistive layer comprises a transition metal oxide layer.

3. The method for fabricating memory device according to claim 1, wherein the buffer layer is an oxygen trap layer.

4. The method for fabricating memory device according to claim 3, wherein the buffer layer comprises Hf, $HfO_x$, Ta, $TaO_x$, $NiO_x$, $TiO_x$, $ZrO_x$, or $ZnO_x$.

5. The method for fabricating memory device according to claim 2, wherein an oxygen content of the transition metal oxide layer is in a saturation state.

6. The method for fabricating memory device according to claim 1, wherein a size of the resistive layer is determined by a horizontal thickness of the resistive layer and a thickness of the buffer layer.

7. The method for fabricating memory device according to claim 1, wherein the noble metal layer reduces oxygen diffused into or away from the resistive layer.

8. The method for fabricating memory device according to claim 1, wherein the top electrode layer is thicker than the noble metal layer and a thickness of the noble metal layer is in a range of 30 to 50 angstroms.

9. The method for fabricating memory device according to claim 1, wherein the step of providing the substrate comprises:
   providing a base layer, comprising an interconnection line structure therein;
   forming an inter-layer dielectric layer on the base layer, the inter-layer dielectric layer comprising an opening;
   forming a through via structure, filling into a lower portion of the opening; and
   forming the bottom electrode layer, filling into an upper portion of the opening.

10. The method for fabricating memory device according to claim 1, wherein the step of providing the substrate comprises:
    providing a base layer, comprising an interconnection line structure therein;
    forming an inter-layer dielectric layer on the base layer, the inter-layer dielectric layer comprising an opening;
    forming a through via structure in a lower portion of the opening; and
    forming the bottom electrode layer, disposed on the inter-layer dielectric layer and above the through via structure,
    wherein the noble metal layer and the bottom electrode layer are isolated at least by the resistive layer.

* * * * *